United States Patent

Morris et al.

Patent Number: 6,109,928
Date of Patent: Aug. 29, 2000

[54] ARRANGEMENT OF TWO DISCONNECTABLE FLAT CONDUCTORS AND A CONNECTION UNIT FOR CONNECTING A FLAT CONDUCTOR

[75] Inventors: Edward Morris, Erding; Eibl Martin, Reithofen; Klaus Pachonik, Taufkirchen; Christian Kürmeier, München; Vanek Wenzel, Haar, all of Germany

[73] Assignee: Océ Printing Systems GmbH, Poing, Germany

[21] Appl. No.: 09/155,371

[22] PCT Filed: Mar. 19, 1997

[86] PCT No.: PCT/DE97/00566

§ 371 Date: Apr. 19, 1999

§ 102(e) Date: Apr. 19, 1999

[87] PCT Pub. No.: WO97/37403

PCT Pub. Date: Oct. 9, 1997

[30] Foreign Application Priority Data

Mar. 28, 1996 [DE] Germany .......................... 196 12 415

[51] Int. Cl.[7] ...................................................... H01R 9/09
[52] U.S. Cl. .............................................................. 439/67
[58] Field of Search ............................. 439/67, 210, 492, 439/493, 497

[56] References Cited

U.S. PATENT DOCUMENTS

| | | | |
|---|---|---|---|
| 4,116,516 | 9/1978 | Griffin | 439/67 |
| 4,647,125 | 3/1987 | Landi et al. | |
| 5,219,292 | 6/1993 | Dickirson et al. | 439/67 |
| 5,373,109 | 12/1994 | Argyrakis et al. | 174/117 TR |
| 5,404,279 | 4/1995 | Wood | 362/145 |

FOREIGN PATENT DOCUMENTS

| | | |
|---|---|---|
| 0 426 553 A1 | 5/1991 | European Pat. Off. . |
| 1 590 081 | of 0000 | Germany . |
| 3438949 A1 | 5/1985 | Germany . |
| 62 281282 | 12/1987 | Japan . |

OTHER PUBLICATIONS

Japanese Abstract, 07061039, Jul. 3, 1995.
A–MP Capitron Power Distribution Systems, Catalog No. 714–8 No Date.

*Primary Examiner*—Steven L. Stephan
*Assistant Examiner*—J. F. Duverne
*Attorney, Agent, or Firm*—Hill & Simpson

[57] ABSTRACT

In an electrographic printer or copier using an LED for exposing the photoconductor, an arrangement of two disconnectable flat conductors are provided which form part of the electrical connection between a current supply and an exposure system. A first flat conductor contains a first current carrying metal strip, at least one second current carrying metal strip which has at least sections thereof in parallel to the first metal strip, and at least one insulating strip which insulates the second metal strip from the first metal strip. The first flat conductor provides a connection with the second flat conductor which has the first metal strip protruding beyond the insulating strip. The second flat conductor has essentially the same geometrical structure as the first flat conductor at least at the connection point. The connection of the first metal strip of the first flat conductor comes into electrical contact with the other metal strip of the second flat conductor and the other metal strip of the first flat conductor comes into electrical contact with the first metal strip of the second flat conductor.

14 Claims, 6 Drawing Sheets

ARRANGEMENT OF TWO DISCONNECTABLE FLAT CONDUCTORS AND A CONNECTION UNIT FOR CONNECTING A FLAT CONDUCTOR

BACKGROUND OF THE INVENTION

1. Field of the Invention

The invention relates to an arrangement of two flat conductors detachable from one another, in which the flat conductors are part of an electrical connection between a current supply and an illumination means in an electrographic LED printer or LED copier apparatus.

2. Description of the Related Art

In the European Patent Application with file number 95 107 809.6, an electrical connection between a current supply and an illumination means in an electrographic LED printer is specified. The print principle of an LED printer can likewise be learned from this reference. In the printing of a line of the print image, a light-emitting diode (LED) is driven for each image point of the line. Standardly, the print density of the image points is so high that several thousand light-emitting diodes are arranged alongside one another. Each light-emitting diode requires a current of a few mA in order to produce a black image point. Due to the large number of light-emitting diodes and the highly fluctuating number of black image points in the printing of different lines, strong current surges occur on the connection line, and, as a consequence thereof, there occurs an exceeding of or falling below the operating voltage. These fluctuations of the operating voltage have a negative effect on the printing of the subsequent line, since non-uniform illuminations result.

A known countermeasure is, as described in the mentioned reference, to use what is called a ramp circuit that regulates the current flow. However, this is an expensive solution that yields unsatisfactory results, especially at high print speeds.

For the execution of maintenance tasks, it is absolutely necessary that the electrical connection between the current supply and the flow. However, this is an expensive solution that yields unsatisfactory results, especially at high print speeds.

For the execution of maintenance tasks, it is absolutely necessary that the electrical connection between the current supply and the illumination means be detachable, i.e. can be carried out without destruction of the connection means. This must be taken into account in designing the connection.

In a product catalog no. 714-8 of AMP, Inc., Elizabethtown, Pa. U.S.A., "A-MP CAPITRON POWER DISTRIBUTION SYSTEMS," imprint 14.8-10M-PP-7.68, 1968, a flat conductor of a power distribution system is specified which has several metal strips for conducting current that are insulated from one another. The ends of the metal strips protrude beyond the insulation in order to enable the connection of further terminals, for example circuit boards. The specified flat conductor is provided for applications in the area of high transmission speeds and high information density.

From DE-A-15 90 81, a flat conductor cable harness is known whose flat conductors have connector pieces. The flat conductors are separated from one another by an insulation. The connector pieces are led out transversely to the run of the flat conductors and respectively serve as part of a screw connection.

In EP-A-0 426 553, a connecting system used for the transmission of high voltage is explained, in which a flat conductor leading to the connecting system is connected with a plug insert. The other end of the plug insert is connected at a further connection point with a second flat conductor leading to the connecting system.

Moreover, the Japanese published patent application JP 62-28182 explains a connecting arrangement for a shielded flat conductor.

SUMMARY OF THE INVENTION

The object of the invention is to indicate a current supply for an LED printer that ensures a high print quality.

This object is achieved by means of an arrangement for connecting two flat conductors detachable from one another, in which the first flat conductor contains a first metal strip for conducting current and at least one second metal strip, arranged at least in segments in parallel to this first metal strip, for conducting current, and at least one insulating strip that determines a distance between the broad side surfaces, facing one another, of the metal strips, the first flat conductor is fashioned at the connection point with the second flat conductor in such a way that the first metal strip protrudes essentially in its entire width beyond the insulating strip, the second flat conductor has, at least at the connection point, essentially the same geometrical construction as the first flat conductor, and in which, at the connection point, at least the first metal strip of the first flat conductor comes into electrical contact with the further metal strip of the second flat conductor, and the further metal strip of the first flat conductor comes into electrical contact with the first metal strip of the second flat conductor, characterized in that the flat conductors create an electrical connection between a current supply and an illumination means in an electrographic LED printer or LED copier apparatus for the transmission of low-voltage current impulses for the LEDs, and in that the first flat conductor is connected immediately with the current supply and the second flat conductor is connected immediately with the illumination means, and are connected with one another at the single connection point.

The arrangement is further characterized in that the metal strips that are in contact overlap one another. The flat conductors contains at the connection point at least one receptacle for a connection means. Preferably, the connection means encloses the two flat conductors at the connection point in the manner of a clamp. The connection means may contain at least one screw connection.

The receptacle may be a through-hole. At least two of the through-holes are located opposite one another on a hole axis. The screw connection is received in at least one through-hole. The connecting means contains at least one pin that is guided through at least one through-hole. In one embodiment, the pin and/or at least a part of the connection means are made of plastic material.

A connection arrangement for connecting a flat conductor connected with a first electrical component to a second electrical component in an electrographic printer or copier apparatus, in particular to a current supply or an LED illumination means, whereby the flat conductor contains a first metal strip for conducting current, and contains a second metal strip arranged parallel to this first metal strip, at least in segments, for conducting current, and contains an insulating strip that determines a distance between the broad side surfaces, facing one another, of the metal strips, and whereby the flat conductor is fashioned at its connection point with the apparatus in such a way that the first metal strip protrudes essentially in its entire width beyond the insulating strip, having a first connection electrode arranged fixedly on the apparatus with a planar contact surface for conducting current and having at least one second connection electrode with a further planar contact surface arranged parallel—at least in segments—to the planar contact surface, for conducting current, and having at least one further insulating strip that insulates the further connection electrode from the first connection electrode, whereby the first connection electrode at the connection point protrudes beyond the further insulating strip, and in which at the connection point at least the first metal strip comes into electrical contact with the further connection electrode and the further metal strip comes into electrical contact with the first connection electrode.

The connection arrangement for connecting a flat conductor connected with a first electrical component to a second electrical component in an electrographic printer or copier apparatus, in particular to a current supply or an LED illumination means, of another embodiment, has the flat conductor contains a first metal strip for conducting current and at least one second metal strip arranged in parallel—at least in segments—to this first metal strip, for conducting current, and contains an insulating strip that determines a distance between the broad side surfaces, facing one another, of the metal strips, and whereby the flat conductor is fashioned at its connection point with the apparatus in such a way that the first metal strip protrudes essentially in its entire width beyond the insulating strip, having a first connection electrode arranged fixedly on the apparatus with a planar contact surface for conducting current and at least one second connection electrode, separated from the first connection electrode by an insulator, with a further planar contact surface for conducting current, whereby the first connection electrode protrudes beyond the further connection electrode at the connection point, and in which at the connection point at least the first metal strip comes into electrical contact with the first connection electrode and the further metal strip comes into electrical contact with the further connection electrode.

The connection arrangement is characterized in that at the connection point there is at least one receptacle for a fastening element.

A terminal arrangement is characterized in that the receptacle is a bore that preferably has an inner threading.

In the inventive arrangement, the first flat conductor contains a lowest metal strip and at least one strip arrangement arranged thereabove consisting of a further metal strip and an insulating strip, which insulates the further metal strip from the metal strip lying thereunder and arranges it in parallel thereto, at least in segments. Moreover, in the vicinity of the connection point with the second flat conductor, the first flat conductor is fashioned in such a way that the metal strip located thereunder protrudes beyond the insulator. The second flat conductor has the same construction as the first flat conductor. At the point of connection, at least the lowest metal strip of the first flat conductor comes into electrical contact with the uppermost metal strip of the second flat conductor, and the uppermost uppermost metal strip of the second flat conductor, and the uppermost metal strip of the first flat conductor comes into electrical contact with the lowest metal strip of the second flat conductor.

The invention is based on the finding that the inductance of the connection between the current supply and the illumination means has an essential influence on the quality of the print image, since the change in the operating voltage is determined by its magnitude, given predetermined changes of the current strength. If voltage fluctuations occur, the light-emitting diodes do not achieve their rated luminosity. This leads to optically perceivable changes in the print image. For this reason, in the invention two flat conductors are connected with one another at a connection point, which, like the flat conductor, has a very low inductance.

A low inductance of the first flat conductor is ensured in that the metal strips in the flat conductor, which are respectively allocated to a voltage potential, have a small spacing from one another, predetermined by an insulating strip located between two adjacent metal strips. In the flat conductor, metal strips are used, because these enable a bending of the flat conductor transverse to the longitudinal direction due to their low rigidity in the longitudinal direction, so that the flat conductor in the LED printer can be angled off according to the required conductor routing.

The invention is further based on the knowledge that the inductance of the connection between the current supply and the illumination means is also essentially co-determined by the inductance of the connection point. For this reason, the useful arrangement of the metal strips inside the first flat conductors is also essentially maintained at the connection point in the invention, by modifying the flat conductor at the connection point in such a way that the first metal strip protrudes beyond the insulating strip and also beyond the additional metal strip, so that a step-type arrangement of the metal strips results at the connection point.

The other flat conductor has the same construction, at least at the connection point. By means of this measure, it is achieved that the step-type gradations of the two flat conductors can be arranged with respect to one another in such a way that the metal strips of the two flat conductors, which are allocated to the same potential, come into electrical contact. The spacing between two adjacent metal strips is also no greater at the connection point than inside the flat conductors, so that the inductance of the overall electrical connection between the current supply and the illumination means has a low inductance at the connection point as well as in the flat conductors. The consequence of the low inductance of the electrical connection between the current supply and the illumination means is that even given a high print resolution achieved by means of a very large number of light-emitting diodes arranged in a row, visible undesired degradations of the print image are avoided, such as those which occur given an undesired drop or excessive increase of the operating voltage due to a high inductance of the electrical connection and simultaneous change in current, since the low inductance leads to a lower change in voltage, given predetermined current changes.

The construction of the connection point is conceivably simple in the invention, since in manufacturing the connection conductor it is necessary also to take into account only the step-type gradation of the metal strips of the respective connection line at the connection point.

By means of the invention, it is achieved that in maintenance tasks the current supply can be separated from the illumination means in a simple manner, in order e.g. to exchange the current supply or the illumination means. Nonetheless, the inductance of the overall connection due to the connection point is not essentially increased.

In an embodiment of the invention, metal strips that are in contact with one another overlap. By means of the overlapping, it is achieved that the electrical contact between metal strips having the same potential of the two flat conductors can be strengthened by means of a pressure in the direction of the overlapping areas.

A further embodiment of the invention consists in that each of the flat conductors contains at the connection point at least one receptacle for a connection means. The connection means connects the two flat conductors with one another in stationary fashion and increases the electrical contact between metal strips of the two conductors with the same potential. A simple variant consists in the use of a screw connection that increases the electrical contact between metal strips touching one another, and simultaneously ensures a reliable mechanical connection between the two flat conductors.

In addition, the invention relates to two connection arrangements for the connection of a flat conductor with the features of patent claim 11 or, respectively, 12. These connection arrangements make it possible to connect a flat conductor with low inductance to the connection arrangement without essentially increasing the inductance of the overall electrical connection due to the connection arrangement. One or more connection electrodes can be of massive construction in the connection arrangements according to the invention, so that they form a mount for the overall connection arrangement. At the same time, one of the massive connection electrodes can be designed as a grounding conductor for a high current flow.

The invention also relates to flat conductors with more than two metal strips, as are required e.g. for a voltage supply with a ground potential, a positive potential and a negative potential. Moreover, in the invention a connection point need not necessarily be arranged at the end of a flat conductor. Flat conductors are also used in which the connection point is not arranged at one of the ends. In this case, there results a branching of the flat conductors at the point of connection.

By means of the invention, it is achieved that given an operating voltage of 3.8 volts, a current flow of 100 A and a switching time of 5 $\mu s$, only a voltage fluctuation of approximately 400 mV remains after 5 $\mu s$. In relation to flat conductors that are not arranged according to the invention, this result represents an improvement by a factor of at least 4.

BRIEF DESCRIPTION OF THE DRAWINGS

In the following, embodiments of the invention are explained on the basis of the drawings.

DETAILED DESCRIPTION OF THE PREFERRED EMBODIMENTS

Figure 1:
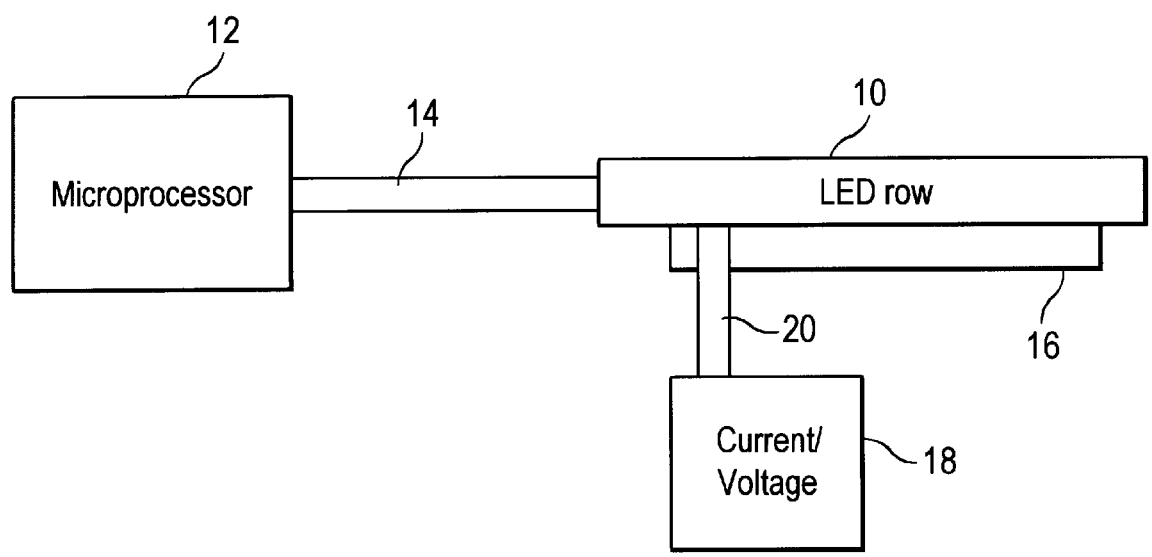
FIG. 1 shows a block switching diagram with essential electrical functional units of an LED printer.

FIG. 1 shows a block switching diagram with selected electrical functional units of an LED printer that prints a print image on paper. An LED illumination row 10 contains a very large number of light-emitting diodes (LED), standardly several thousand. The light-emitting diodes are arranged next to one another in a row, so that within the row no mechanical motion need be carried out for the illumination of a photoconductive layer (not shown). The light-emitting diodes must illuminate the photoconductive layer with a predetermined light energy, so that as a result a print image of high quality is achieved. A microprocessor 12 drives the LED illumination row 10 via a bus system 14 in such a way that the desired print image results. Since a large quantity of heat arises during printing due to the large number of light-emitting diodes, the LED illumination row 10 is arranged on a carrier 16 that carries off the heat that arises and simultaneously conducts ground potential.

A current/voltage supply 18 supplies the necessary energy for the illumination to the LED illumination row 10 via a connection line 20. Although during illumination of the photoconductive layer each light-emitting diode consumes only a relatively small current in the mA range, the current consumption of the overall LED illumination row 10 combines during illumination of a row, to a quantity of up to 100 A. If for example a completely unilluminated row follows a completely illuminated row, a current fluctuation of up to 100 A occurs in a very short time span in the microsecond range. Increased demands with respect to the inductance thus result for the current/voltage supply 18 and the electrical connection line 20. In order to avoid voltage fluctuations, the inductance, in particular of the electrical connection line 20, must be low. Since, moreover, for maintenance tasks the current/voltage supply 18 must be detachable from the LED illumination row 10 or, respectively, the carrier 16, the demands with respect to the inductance also carry over to the connection point between the LED illumination row 10 and the current/voltage supply 18.

Figure 2:
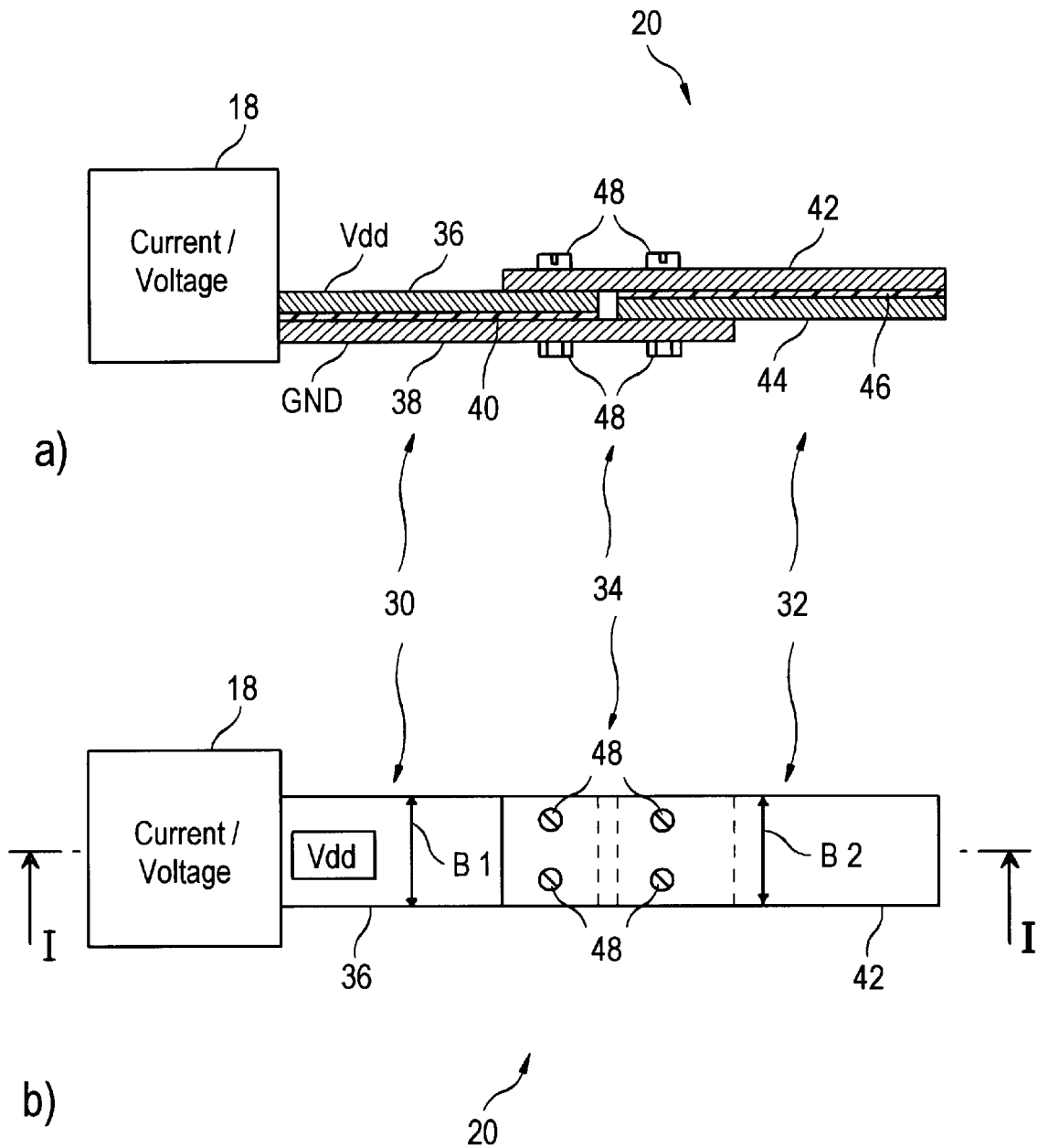
FIGS. 2a and 2b show a first embodiment with two flat conductors detachable from one another.

FIG. 2 shows a first embodiment with an arrangement of two flat conductors 30 and 32 detachable from one another, which are part of the electrical connection line 20. In a part a of FIG. 2, a sectional representation of the two flat conductors 30 and 32 at a connection point 34 is shown. The section was carried out along a section line I shown in Part b of FIG. 2. A first flat conductor 30 contains a first metal strip 36 for the conducting of a positive potential Vdd, a further metal strip 38 for conducting a ground potential GND, and an insulating strip 40 that electrically insulates the metal strips 36 and 38 from one another and arranges them in a defined state to one another.

A second flat conductor 32 has in the region of the connection point 34 essentially the same construction as the flat conductor 30. It contains a metal strip 42 for conducting the positive potential Vdd, a metal strip 44 for conducting the ground potential GND, and an insulating strip 46 arranged between the metal strips 42 and 44, which insulates the metal strips 42 and 44 from one another and arranges them at a defined spacing from one another. At the connection point 34, the metal strip 38 of the first flat conductor 30 protrudes beyond the insulating strip 40 and the metal strip 36. Likewise, the metal strip 42 of the second flat conductor 32 protrudes beyond the insulating strip 46 and the metal strip 44. In this way, it is possible to arrange the flat conductors 30 and 32 at the connection point in such a way that the metal strip 36 and the metal strip 42 overlap immediately at the connection point 34 and come into electrical contact. Likewise, the metal strips 38 and 44 overlap at the connection point 34, whereby the two metal strips 38 and 44 come into electrical contact.

The electrical contact between the flat conductors 30 and 32 is increased by a connection consisting of four screw connections 48, which presses overlapping regions of the metal strips 36, 42 or, respectively, 38, 44 against one another in non-positive fashion, and which in addition ensures that the flat conductors 30 and 32 can receive tensile stress or, respectively, pressure stress in the longitudinal direction without detaching the connection at the connection point 34.

Part b of FIG. 2 shows the flat conductors 30 and 32 at the connection point 34 in a top view. The flat conductors 30 and 32 respectively have the same width B1 or, respectively B2, and are arranged with respect to one another in such a way that there is no offset with respect to the widths B1 and B2.

The screw connections 48 are insulated from the metal strips 36, 38, 42 or, respectively, 44 by means of suitable measures. An insulation can be achieved by the use of screw connections 48 made of plastic material. Alternatively, an insulation of the screw connection 48 can be achieved by the use of insulating washers in the region of the screw head and the nut as well as by means of insulating spacers between the respective screw body and the relevant metal strip.

Figure 3:
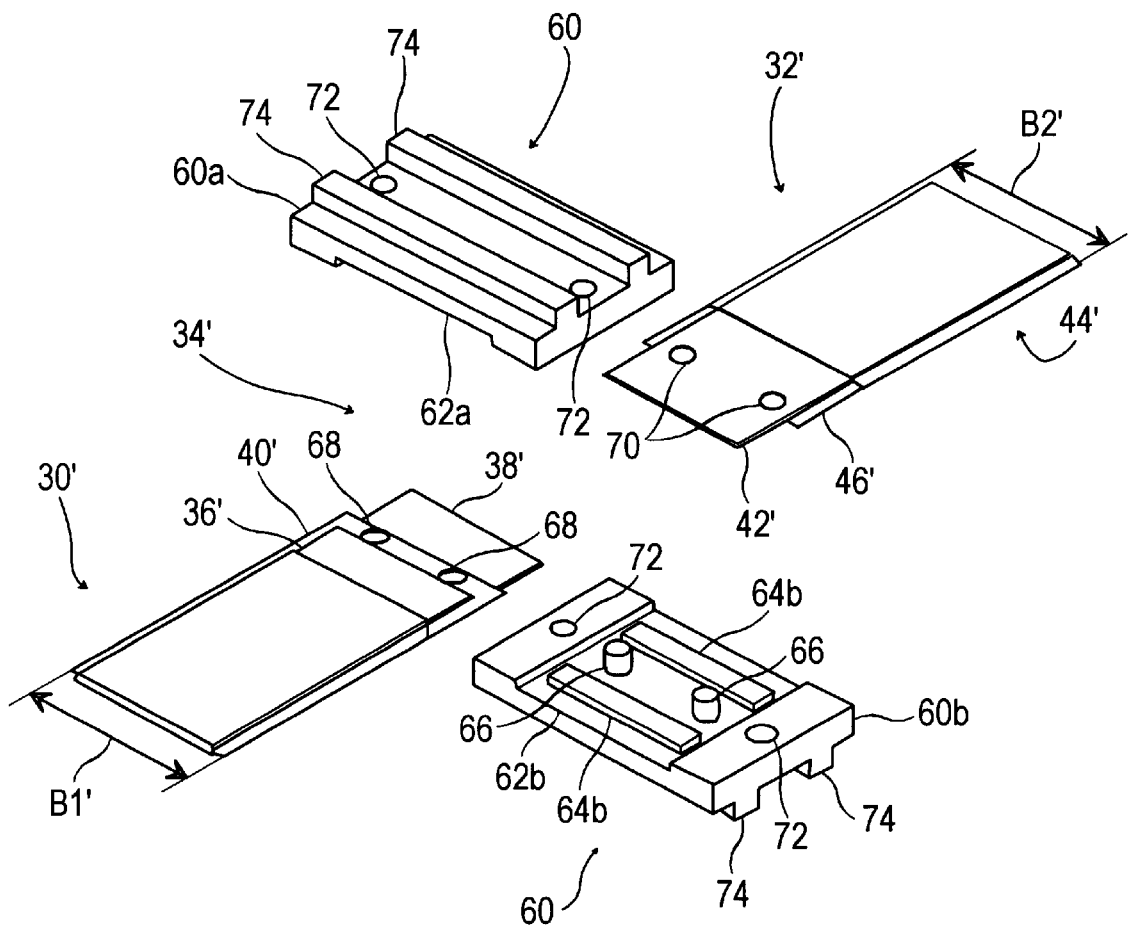
FIG. 3 shows a second embodiment with two flat conductors detachable from one another.

FIG. 3 shows a second embodiment with an arrangement of two flat conductors 30' and 32' detachable from one another, connected with one another at a connection point 34' with the aid of a two-part fastening clamp 60 consisting of two halves 60a and 60b. The flat conductors 30' and 32' are constructed in the same way as the flat conductors 30 and 32, so that components already explained there with the same function are not again explained, but are identified with a superior stroke.

The insulating strips 40' and 46' protrude beyond metal strips 36', 38' or, respectively, the metal strips 42', 44' in the transverse direction of the flat conductor 30' or, respectively, 32' on both sides. By this means, the insulating effect is increased, and in particular short circuits between the metal strips 36', 38' or, respectively, 42', 44' due to external mechanical influences are prevented.

The flat conductors 30' and 32' are coated with a plastic material outside the connection point 32', which prevents undesired contact and protects the surface of the metal strips 36', 38' or, respectively, 42', 46'.

The half 60a or, respectively, 60b of the fastening clamp 60 consists of an insulating plastic material and has recesses 62a or, respectively, 62b of width B1' or, respectively, B2' in the longitudinal direction of the flat conductors 30' and 32' for receiving the flat conductors 30' and 32'. Coverings 64a or, respectively, 64b, made of an elastic material, are glued into the recesses 62a or, respectively, 62b, and ensure a uniform pressure of the halves 60a and 60b on the flat conductors 30' and 32', and thereby also a uniform pressure of the flat conductors 30' and 32' against one another. In addition, pins 66 are located in the recess 62b, which in the assembled state are received by through-holes 68 in the region of the connection point 34' in the flat conductor 30' and by through-holes 70 in the flat conductor 32'. In the assembled state, the ends of the pins 66 are received by bores (not shown) in the region of the recess 62a. The assembly of the fastening clamp 60 takes place in that screw connections (not shown) are screwed through reception bores 72 in both halves 60a and 60b of the fastening clamp 60 on both sides of the flat conductor 30' and 32'. Ribs 74 on the outward-facing surfaces of the halves 60a and 60b of the fastening clamp 60 serve for rigidity.

Figure 4:
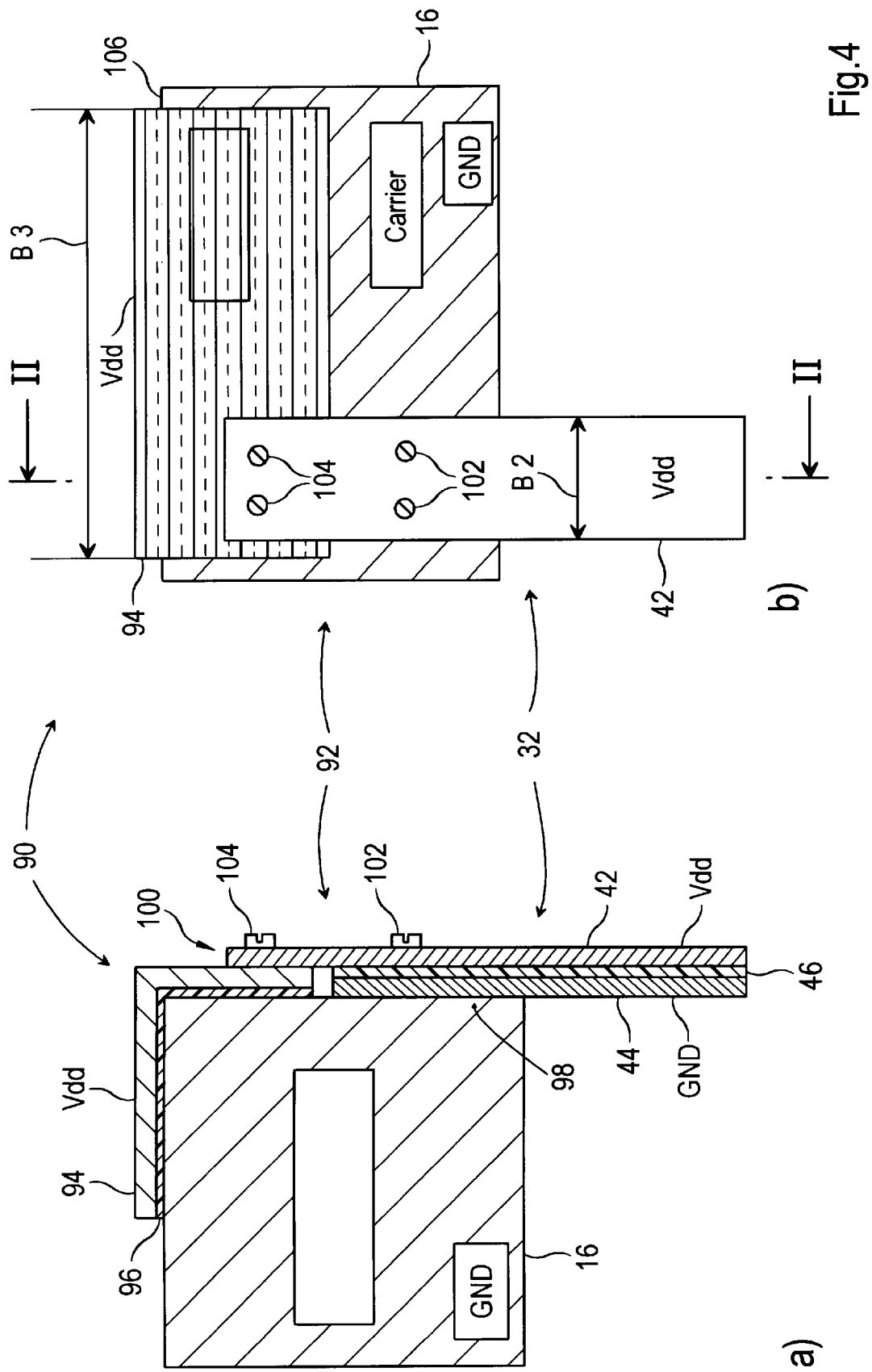
FIGS. 4a and 4b show a third embodiment with a connection arrangement for the connection of a flat conductor.

FIG. 4 shows a third embodiment with a terminal arrangement 90 for the flat conductor 32 on the carrier 16 in a sectional view along a sectional line ll shown in Part b of FIG. 4.

The connection arrangement 90 is formed by a part of the surface of the carrier 16 that stands in plane contact with the metal strip 44 at a connection point 92. The connection arrangement 90 additionally contains a metal electrode 94, angled off at its end, for conducting the positive potential Vdd from the metal strip 42 to the LED illumination row 10. The metal electrode 94 is held at a predetermined distance in relation to the carrier 16 by an insulating strip 96. This distance is selected to be small, so that a low inductance results between the carrier 16 and the metal electrode 96. At the connection point 92, the metal strip 42 protrudes beyond the insulator 46 and the metal strip 44. The carrier 16 also protrudes beyond the metal electrode 96. In this way, it is possible for the metal strip 44 to come into contact with the carrier 16, and for the metal strip 42 to come into contact with the metal electrode 96, in overlapping fashion at planar contact surfaces 98 or, respectively, 100. The ground potential GND and the positive potential Vdd are held at a small distance from one another in the overall region of the connection point 92, whereby the inductance at the connection point is also low.

In order to increase the contact at the contact surfaces 98 or, respectively, 100, and in order to connect the flat conductor 32 in stationary fashion with the carrier 16, screw connections 102 and 104 are present in the region of the connection point. The screw connection 102 runs through bores made at the connection point 92 in the metal strip 42, in the insulating strip 46, and in the metal strip 44, and ends in a bore with an inner threading in the carrier 16. The screw connection 104 runs through a bore arranged above the connection 102 in the metal strip 42, through bores in the metal electrode 96 and in the insulating strip 94, and ends in a further bore with an inner threading in the carrier 16.

Part b of FIG. 4 shows the connection arrangement 90 with the connected flat conductor 32 in a top view, in which the sectional line II is drawn in. The metal electrode 94 has a width B3 that has a larger value than does the width B2 of the flat conductor 32. The angling off of the metal electrode 96 at one edge 106 of the carrier 16 makes it possible to guide the flat conductor 32 to the carrier 16 from below, in order to use effectively the constructive space provided in the LED printer.

Figure 5:
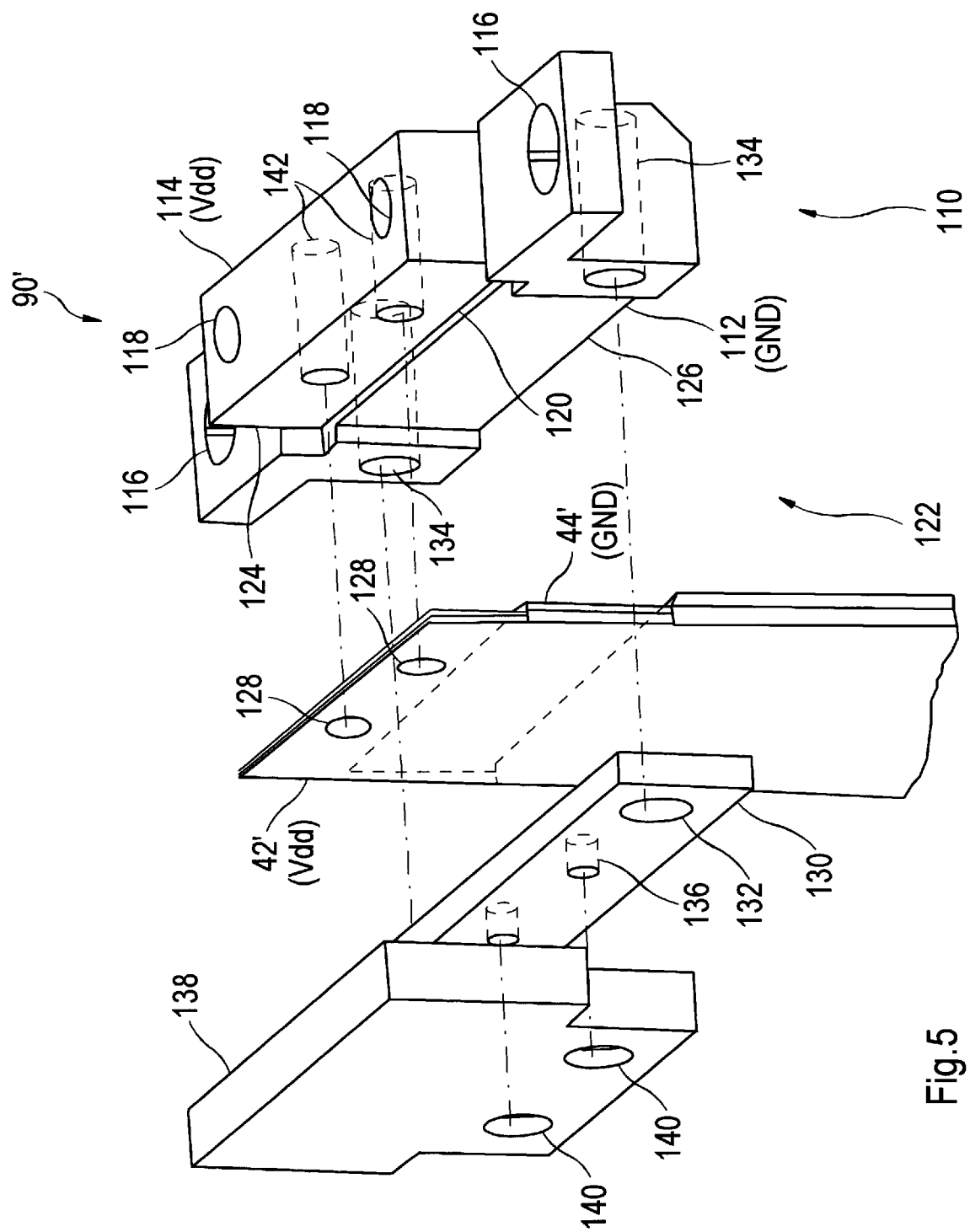
FIG. 5 shows a fourth embodiment with a connection arrangement for the connection of a flat conductor.

FIG. 5 shows a fourth embodiment with a connection arrangement 90' for the connection of the flat conductor 32'. The connection arrangement 90' is an adapter consisting of two connection electrodes 112 and 114. The connection electrode 112 is screwed to the carrier 16 with a screw connection that runs through through-holes 116. The connection electrode 114 is fastened to a current rail at the apparatus side for conducting the positive potential Vdd, likewise with a screw connection that runs through through-holes 118 with inner threading.

The two connection electrodes 112 and 114 are insulated from one another by an air gap 120 with a small thickness. The connection electrode 114 protrudes beyond the connection electrode 112 at a connection point 122, so that a planar contact surface 124 on the connection electrode 114 form [sic] a step in relation to a planar contact surface 126 on the connection electrode 112.

The connection of the flat conductor 32' takes place in that the metal strip 42' is laid on the contact surface 124 and the metal strip 44' is laid on the contact surface 126. In a second step, the flat conductor 32' is fastened. The fastening thereby takes place in such a way that through-bores 128 need be present only in the metal strip 42'. In this way, measures relating to the insulation between the potentials Vdd and GND can be minimized. A fastening rail 130 is fastened to the connection electrode 112 via a screw connection through through-holes 132 in the fastening rail 130 and bores with inner threading 134 in the connection electrode 112, so that the flat conductor 32' is already held fast in its position in relation to the connection arrangement 90. In addition, bores 136 with inner threading are located in the fastening rail 130.

A cover plate 138 contains through-bores 140 through which a further screw connection is guided that ends in the bores 136, whereby the cover plate 138 is connected with the fastening rail 130 to form a unit. Recesses (not shown) are arranged on the cover plate 138 that receive the screw heads of screws that run through the through-holes 128 and end in bores 142 with inner threading in the connection electrode 114, so that in the assembled state the flat conductor 32' is connected in stationary fashion with the connection arrangement 90' and an undesired touching of the screws is prevented.

The fastening rail 130 is metallic and the cover plate 138 is made of plastic material. In addition, the cover plate 138 serves as contact protection against undesired touching of the potential-conducting components in the region of the connection point 122 by operating personnel.

Figure 6:
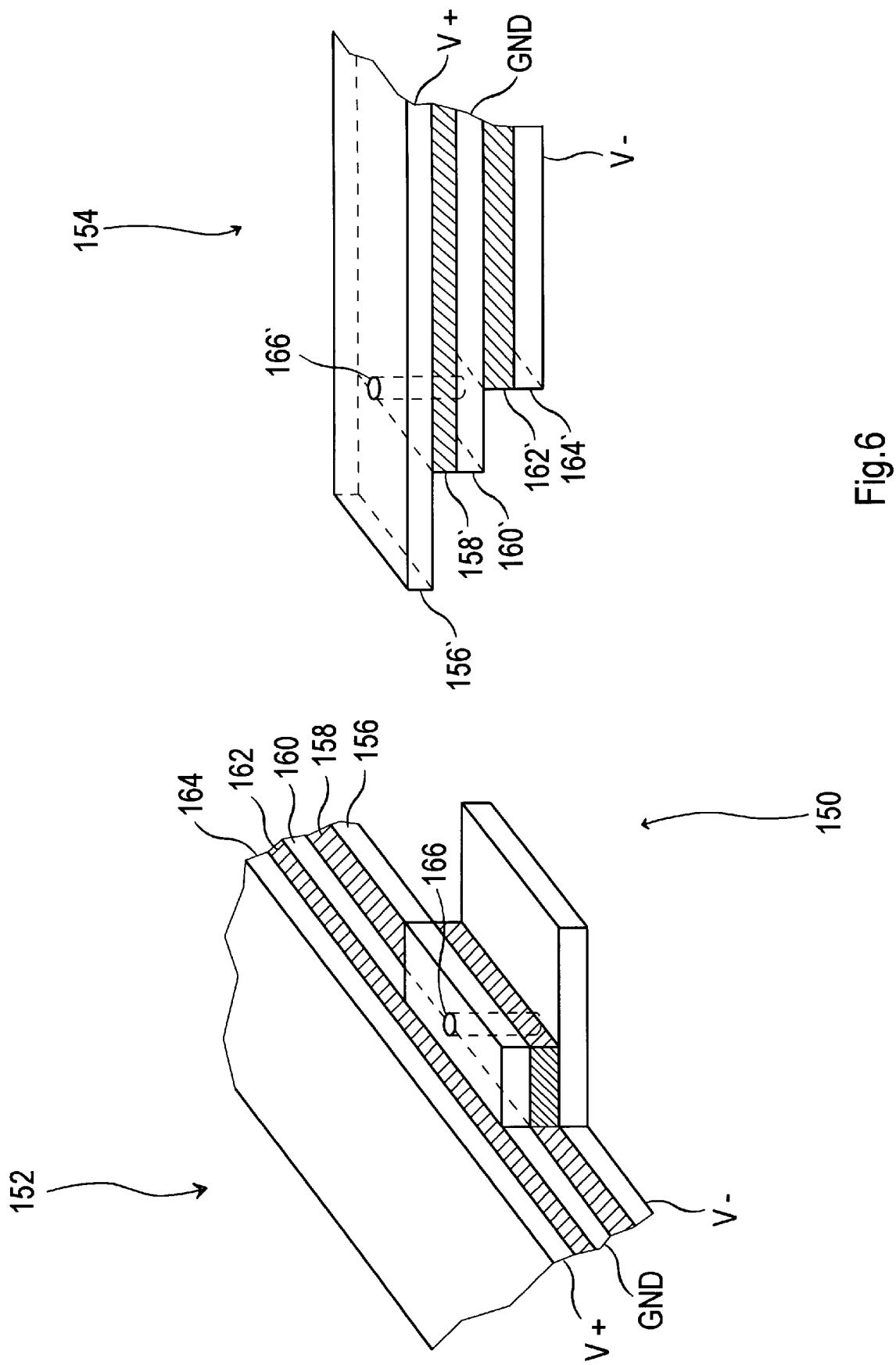
FIG. 6 shows a fifth embodiment having two flat conductors detachable from one another at a branching point, and respectively containing three metal strips.

FIG. 6 shows a fifth embodiment with two flat conductors 152 and 154 detachable from one another at a connection point 150. The flat conductor 152 contains a first metal strip 156, an insulating strip 158 arranged above the first metal strip 156, and a further metal strip 160. The insulating strip 158 insulates the metal 160 from the metal strip 156 and arranges the metal strip 160 in parallel fashion—at least in segments—to the metal strip 156. The flat conductor 152 additionally contains a further insulating strip 162 and a third metal strip 164 that is insulated from the metal strip 160 located thereunder by the insulating strip 142 and is arranged parallel to the metal strip 160, at least in segments.

The metal strip 156 conducts a negative potential V−, the metal strip 160 conducts a ground potential GND, and the metal strip 164 conducts a positive potential V+. The potentials V−, GND and V+ are produced by the current/voltage supply 18.

The flat conductor 152 branches in the region of the connection 150. The metal strip 156 protrudes beyond the insulating strip 158 and beyond the metal strip 160. At the connection point 150, the metal strip 160 protrudes beyond the insulating strip 162 and also beyond the metal strip 164.

At the branch point 150, the flat conductor 154 has essentially the same geometric construction as the flat conductor 152, so that components already explained retain the same reference character, but with a superior stroke. However, in the flat conductor 154, the potential sequence on the metal strips 156', 160' and 164' is the reverse of the potential sequence on the metal strips 156, 160 and 164. Thus, in the connected state of the flat conductors 152 and 154 the metal strip 156' conducts the positive potential V+, the metal strip 160' conducts the ground potential GND and the metal strip 164' conducts the negative potential V−. The metal strips 154 and 156' allocated to the positive potential V+, the metal strips 160 and 160' allocated to the ground potential GND, and the metal strips 156 and 164' allocated to the negative potential V− respectively come into electrical contact in the connected state of the flat conductors 152 and 154, whereby they respectively immediately overlap one another.

A screw connection (not shown) led through through-bores 166 and 166' connects the flat conductors 152 and 154 with one another in stationary fashion. The through-bores 166 and 166' are thereby arranged in such a way that the front surfaces of metal strips located opposite one another 158–164 and 158' and 164' do not touch one another.

Although other modifications and changes may be suggested by those skilled in the art, it is the intention of the inventors to embody within the patent warranted hereon all changes and modifications as reasonably and properly come within the scope of their contribution to the art.

What is claimed is:

1. An arrangement of two flat conductors detachable from one another, comprising:

the first flat conductor including a first metal strip for conducting current and at least one second metal strip, arranged at least in segments in parallel to this first metal strip, for conducting current, and at least one insulating strip that determines a distance between broad side surfaces, facing one another, of the metal strips, the first flat conductor is fashioned at a connection point with the second flat conductor in such a way that the first metal strip protrudes essentially in its entire width beyond the at least one insulating strip, the second flat conductor has, at least at the connection point, essentially a same geometrical construction as the first flat conductor, in which, at the connection point, at least the first metal strip of the first flat conductor comes into electrical contact with a further metal strip of the second flat conductor, and a further metal strip of the first flat conductor comes into electrical contact with the first metal strip of the second flat conductor, the flat conductors create an electrical connection between a current supply and an illumination apparatus in an electrographic LED printer or LED copier apparatus for transmission of low-voltage current impulses for LEDs, and the first flat conductor is connected immediately with the current supply and the second flat conductor is connected immediately with the illumination apparatus, and are connected with one another at a single connection point.

2. An arrangement according to claim 1, wherein the metal strips that are in contact overlap one another.

3. An arrangement according to claim 1, wherein each of the flat conductors contains at the single connection point at least one receptacle for a connection apparatus.

4. An arrangement according to claim 3, wherein the connection apparatus encloses the two flat conductors at the single connection point in the manner of a clamp.

5. An arrangement according to claim 3, wherein the connection apparatus includes at least one screw connection.

6. An arrangement according to claim 3, wherein the at least one receptacle is at least one through-hole.

7. An arrangement according to claim 6, wherein said at least one through-hole is at least two through-holes which are located opposite one another on a hole axis.

8. An arrangement according to claim 6, further comprising:

a screw connection is received in the at least one through-hole.

9. An arrangement according to claim 6, wherein the connecting apparatus includes at least one pin that is guided through the at least one through-hole.

10. An arrangement according to claim 9, wherein at least a part of the connection apparatus is of plastic material.

11. A connection arrangement for connecting a flat conductor connected with a first electrical component to a second electrical component in an electrographic printer or copier apparatus, comprising:

the flat conductor including a first metal strip for conducting current, and a second metal strip arranged parallel to said first metal strip, at least in segments, for conducting current, and an insulating strip that determines a distance between the broad side surfaces, facing one another, of the metal strips, the flat conductor is fashioned at a connection point with the electrographic printer or copier apparatus in such a way that the first metal strip protrudes substantially for an entire width beyond the insulating strip, a first connection electrode arranged fixedly on the electrographic printer or copier apparatus with a planar contact surface for conducting current and having at least one second connection electrode with a further planar contact surface arranged parallel—at least in segments—to the planar contact surface, for conducting current, and having at least one further insulating strip that insulates a further connection electrode from the first connection electrode, the first connection electrode at the connection point protruding beyond the at least one further insulating strip, and at the connection point at least the first metal strip comes into electrical contact with the further connection electrode and a further metal strip comes into electrical contact with the first connection electrode.

12. A connection arrangement for connecting a flat conductor connected with a first electrical component to a second electrical component in an electrographic printer or copier apparatus, comprising:

the flat conductor including a first metal strip for conducting current and at least one second metal strip arranged in parallel—at least in segments—to said first metal strip, for conducting current, and an insulating strip that determines a distance between broad side surfaces, facing one another, of the first and second metal strips, the flat conductor is fashioned at a connection point with the electrographic printer or copier apparatus in such a way that the first metal strip protrudes substantially of an entire width beyond the insulating strip, a first connection electrode arranged fixedly on the electrographic printer or copier apparatus with a planar contact surface for conducting current and at least one second connection electrode, separated from the first connection electrode by an insulator, with a further planar contact surface for conducting current, the first connection electrode protrudes beyond the at least one second connection electrode at the connection point, and at the connection point at least the first metal strip comes into electrical contact with the first connection electrode and the further metal strip comes into electrical contact with the further connection electrode.

13. A connection arrangement according to claim 11, further comprising:

at least one receptacle for a fastening element at said connection point.

14. A connection arrangement according to claim 11, wherein the at least one receptacle is a bore.

* * * * *